United States Patent
Grodzki

(10) Patent No.: US 10,132,893 B2
(45) Date of Patent: Nov. 20, 2018

(54) MAGNETIC RESONANCE FINGERPRINTING METHOD AND APPARATUS

(71) Applicant: Siemens Aktiengesellschaft, Munich (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 392 days.

(21) Appl. No.: 14/956,739

(22) Filed: Dec. 2, 2015

(65) Prior Publication Data
US 2016/0154078 A1 Jun. 2, 2016

(30) Foreign Application Priority Data
Dec. 2, 2014 (DE) .......................... 10 2014 224 662

(51) Int. Cl.
*G01R 33/50* (2006.01)
*G01R 33/561* (2006.01)
*G01R 33/48* (2006.01)

(52) U.S. Cl.
CPC ........... *G01R 33/50* (2013.01); *G01R 33/482* (2013.01); *G01R 33/5611* (2013.01)

(58) Field of Classification Search
CPC ... G01R 33/50; G01R 33/482; G01R 33/5611
See application file for complete search history.

(56) References Cited

U.S. PATENT DOCUMENTS

| | | | | |
|---|---|---|---|---|
| 2007/0096733 A1* | 5/2007 | Arunachalam | .... | G01R 33/5611 324/309 |
| 2013/0265047 A1* | 10/2013 | Griswold | ............... | G01R 33/56 324/309 |
| 2014/0167754 A1 | 6/2014 | Jerecic et al. | | |
| 2015/0301141 A1* | 10/2015 | Griswold | ........... | G01R 33/5608 382/131 |
| 2015/0301142 A1* | 10/2015 | Griswold | ........... | G01R 33/5608 324/309 |
| 2016/0061922 A1* | 3/2016 | Grodzki | ............. | G01R 33/5608 324/309 |
| 2016/0278661 A1* | 9/2016 | Griswold | ............... | A61B 5/055 |

(Continued)

OTHER PUBLICATIONS

Ma et al., "Magnetic Resonance Fingerprinting," Nature 495.7440, pp. 187-192 (2013).

(Continued)

*Primary Examiner* — Rodney Bonnette
(74) *Attorney, Agent, or Firm* — Schiff Hardin LLP

(57) ABSTRACT

In a method and a magnetic resonance (MR) apparatus for examining a predetermined volume of an examination object, a number of MR images of the volume are acquired. An MR waveform for voxels of the volume is created from the acquired MR images. An MR waveform of the respective voxel is compared with stored MR waveforms to determine which of the stored MR waveforms best corresponds to the MR waveform. A physical value and/or a substance for a voxel is determined as a result of the comparison. Each k-space that corresponds to one of the MR images is scanned using a number of repetitions, wherein each repetition includes an RF excitation and a read-out of MR data.

16 Claims, 3 Drawing Sheets

(56) References Cited

U.S. PATENT DOCUMENTS

2016/0282430 A1* 9/2016 Gulani .............. G01R 33/4828

OTHER PUBLICATIONS

Christen et al., "MR vascular fingerprinting: A new approach to compute cerebral blood volume, mean vessel radius, and oxygenation maps in the human brain," NeuroImage, vol. 89, pp. 262-270 (2014).

Davies et al., "A Compressed Sensing Framework for Magnetic Resonance Fingerprinting," http://arxiv.org/abs/1312.2465; Version of Jun. 6, 2014 (2014).

* cited by examiner

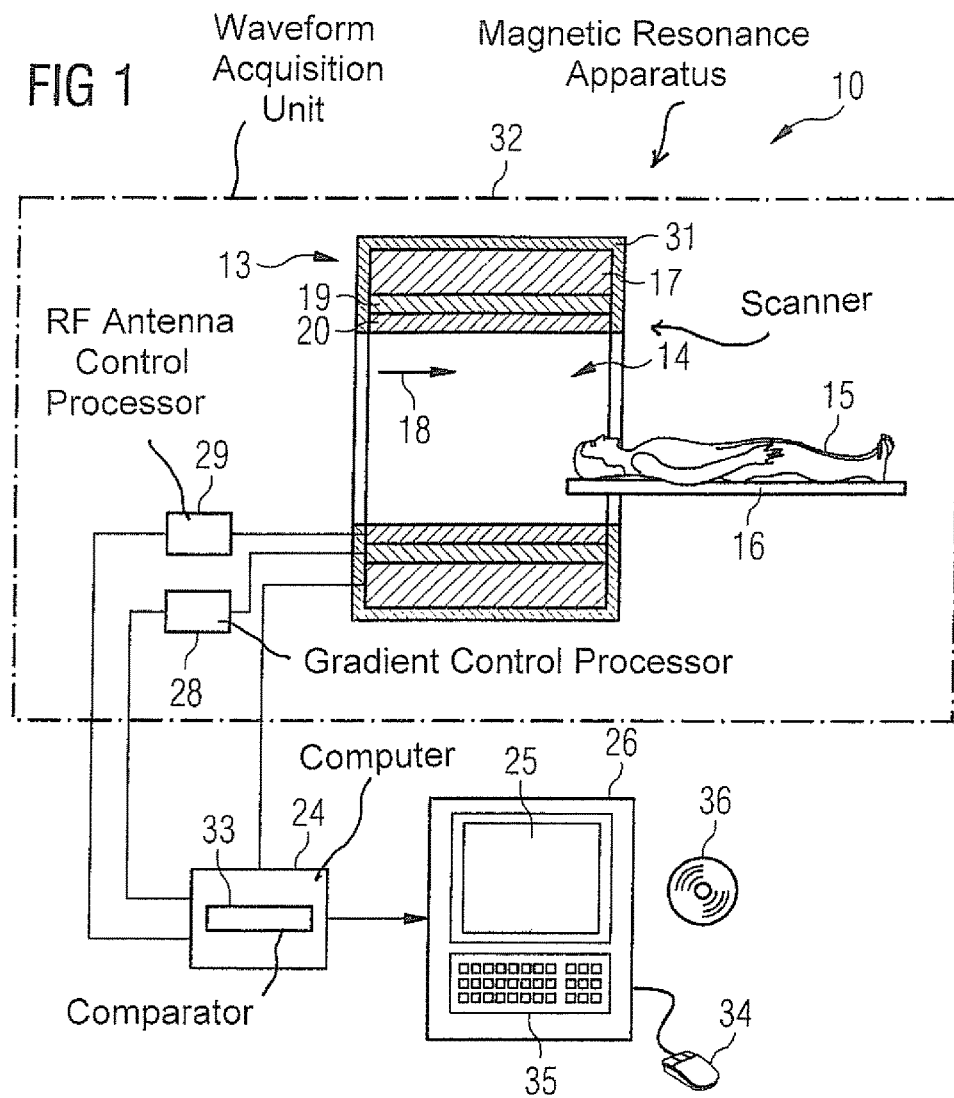

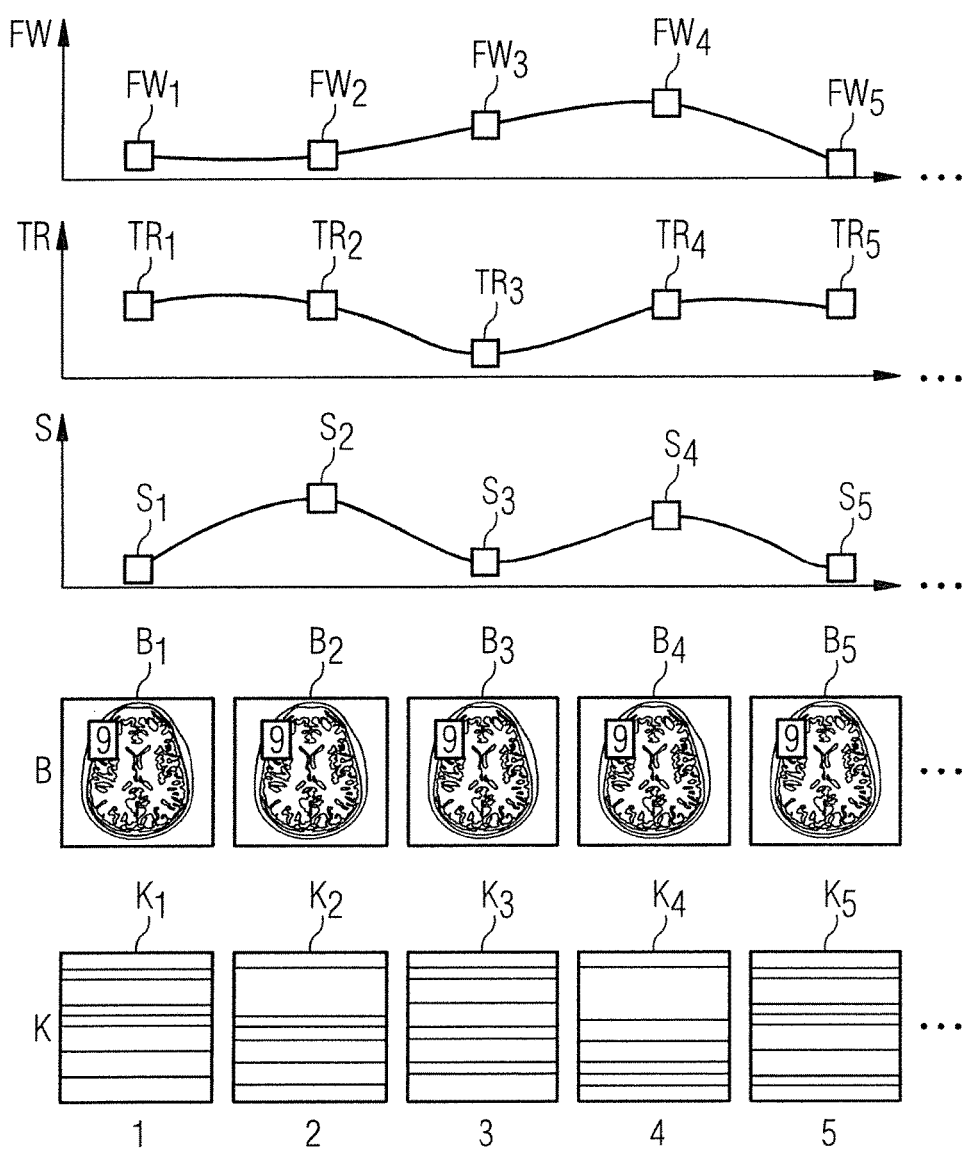

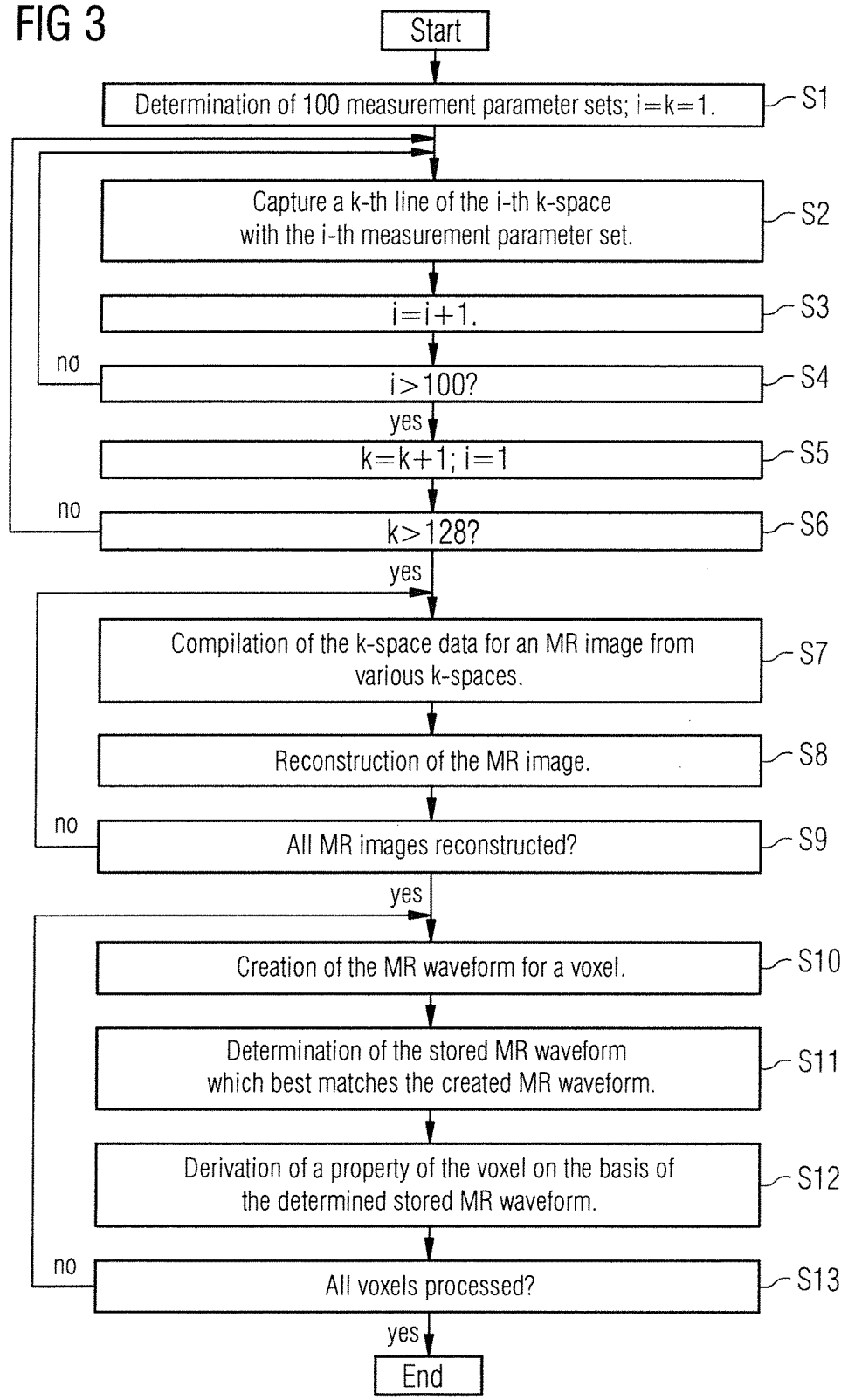

MAGNETIC RESONANCE FINGERPRINTING METHOD AND APPARATUS

BACKGROUND OF THE INVENTION

Field of the Invention

The present invention concerns an examination of an examination subject using a magnetic resonance (MR) facility based on a fingerprinting measurement.

Description of the Prior Art

In clinical imaging, MR images usually display only a qualitative contrast. The exact pixel values are subject to many influences, such as the parameter settings selected for measurement (e.g. TE, TR, range) and factors that cannot be influenced by the user (e.g. coil sensitivity, software versions, scanner type).

With many applications, a so-called quantitative MR image would be desirable in which the pixel values would correspond to "genuine" physical variables (e.g. the T1 relaxation time, the T2 relaxation time, the off-resonance, the proton density). So-called MR fingerprinting, which is described in "Magnetic Resonance Fingerprinting", Ma inter alia, Nature 2013 Mar. 14; 495(7440): 187-192. doi: 10.1038/nature11971, is one such quantitative MR imaging method. With MR fingerprinting numerous measurements are performed, wherein measurement parameters or recording parameters (e.g. flip angle, TR (Time to repetition), TE (Echo Time), TI (Inversion Time), an embodiment and/or a number of RF pulses, an embodiment and/or a number of gradient pulses, diffusion coding) are varied pseudo-randomly. The MR signal for each voxel is determined for each measurement, thus producing an MR waveform characteristic of the voxel and/or pixel for each voxel and/or pixel, which may be regarded as a fingerprint. With the use of a database, such a fingerprint may be assigned to a certain n-tuple of physical values (e.g. T1 relaxation time, T2 relaxation time, off-resonance, proton density), and thus to a certain substance (e.g. CSF, gray matter, fat).

MR waveforms are stored in the database for many of these n-tuples of physical values for the pseudo-random variation of the recording parameters. Usually, these stored MR waveforms are generated by a simulation with the use of Bloch equations depending on the pseudo-random variation of the recording parameters. In order, for example, to have an MR waveform for each combination of a T1 relaxation time in a range of 100 ms to 5000 ms and a T2 relaxation time in a range of 10 ms to 2000 ms with a resolution of 10 ms, almost 100,000 MR waveforms must be available.

In order for the MR waveform or fingerprint characteristic of each voxel and/or pixel to be sufficiently meaningful, a large number (up to 5000) of MR images is acquired for the generation of this MR waveform. According to the prior art, so-called single-shot MR methods are used with which, for each repetition, i.e. based on only one RF excitation pulse, the entire MR image is acquired, i.e., the entirety of k-space is filled. Usually a spiral k-space trajectory with high undersampling is employed. Accordingly, the MR images that are created in the process are very heavily overlaid by artifacts, which may be ascribed to undersampling but may also be due to system inaccuracies of the MR scanner.

SUMMARY OF THE INVENTION

An object of the present invention is to improve the quality of the MR images that are acquired for a fingerprinting measurement in order to improve the overall quality of the fingerprinting measurement.

This object is achieved in accordance with the present invention by a method for examining a predetermined volume section of an examination object using a magnetic resonance facility wherein a number of MR images of the volume section are acquired with the measurement parameters being varied, as is usual with a fingerprinting measurement as described above. It is important that the MR data (e.g. k-space lines) of the same MR image are acquired using the same measurement parameters in each case. For particular or all voxels of the volume section, in each case an MR waveform is created depending on the acquired MR images. The created and/or measured MR waveforms of the respective voxels are compared with stored or saved MR waveforms in order to determine which of the stored MR waveforms best corresponds to the measured MR waveform. The result of the comparison is provided as an output. The result of this comparison may, for example, correspond to an n-tuple of physical values assigned to the stored MR waveform ascertained and/or a substance assigned to this MR waveform.

Each k-space that corresponds to one of the MR images or which is sampled for the reconstruction of the respective MR image is measured or sampled using a number of repetitions, wherein each of these repetitions includes an RF excitation and a read-out of MR data. In other words, a multi-shot MR method rather than a single-shot MR-method, is used for the creation or acquisition of each MR image.

By using multi-shot MR methods (i.e. each MR image is captured using a number of repetitions), the image quality of the individual MR images can be significantly increased compared with the prior art, in which single-shot MR methods are used. Due to the improved image quality, the length of the measured MR waveforms can be drastically reduced, for example, to only 100 measuring points per MR waveform for a fingerprinting MR measurement so that instead of up to 5000 MR images to be captured according to the prior art only 100 MR images are captured.

Advantageously, k-spaces are undersampled in the process.

For example, by only actually measuring 20%, 30% or only 50% of all k-space lines per MR image, the measurement duration can be advantageously reduced accordingly.

In the process, k-space center region is advantageously undersampled less than peripheral k-space regions.

As the contrast of an MR image (i.e. the signal intensities which are essential for an MR fingerprinting measurement) is primarily produced by k-space points in or in the vicinity of k-space center, it is advantageous to undersample k-space center less than external k-space areas, or to completely sample k-space center.

The frequency with which a certain area is sampled inside all k-spaces to be acquired (filled) is lower, the farther the area is from k-space center.

If the MR waveform (fingerprint) of a voxel has n measuring points, for example, usually n MR images must be produced and therefore n k-spaces recorded. Without undersampling, each k-space point is therefore sampled n times. In accordance with the aforementioned rule, a k-space point for capturing the MR data for the n MR images is sampled more frequently the closer that k-space point is to k-space center. Therefore, while k-space points in the vicinity of k-space center are sampled almost n times, k-space points in the peripheral area of k-space are sampled much less frequently.

Nevertheless, it may be useful to sample each k-space point at least once when capturing the MR data for the n MR images.

If k-space is sampled in the Cartesian manner, wherein one repetition is used for each k-space line to be sampled, it is accordingly useful to capture each k-space line at least once as part of the MR fingerprinting measurement according to the invention.

Even if the measurement parameters for the various MR images that are to be recorded as part of the MR fingerprinting measurement differ, the MR signal for k-space points in the external (peripheral) region of k-space scarcely distinguishes between the various MR images. That is to say, an MR signal that is measured (detected) during the measurement of a particular MR image for a particular k-space point in k-space peripheral area scarcely differs from an MR signal that is detected during the measurement of another MR image for the same k-space point. Therefore the MR signal of a particular k-space point can be used in k-space peripheral area for a number of (in extreme cases, all) MR images, although the corresponding k-space point was only measured once.

The undersampling for MR fingerprinting measurement according to the invention should be distributed as well as possible (taking into consideration the above rule(s), as uniformly as possible) over k-spaces of the individual MR images. For example, the first k-space line cannot be recorded in the first k-space (i.e. in k-space of the first MR image) while the second k-space line is being recorded. The second k-space line cannot be recorded in the second k-space while the first k-space line is being recorded, etc. For the reconstruction of the first MR image, the data of the first k-space line of the second k-space is then used for the first k-space, while for the reconstruction of the second MR image the data of the second k-space line of the first k-space is used for the second k-space.

In accordance with an embodiment of the invention, an iterative reconstruction method can be used for the reconstruction of undersampled MR images.

With an iterative reconstruction method as used, for example, for compressed sensing, an MR image is reconstructed on the basis of the captured MR data and/or raw data. Then certain properties of this MR image (for example, the density distribution) are determined and compared with the captured MR data. As a result of this comparison, the reconstructed MR image can be corrected. This procedure can be continued until a defined cancellation criterion is fulfilled.

The iterative reconstruction method can also operate with a model, wherein one of the MR images already reconstructed, which is referred to hereinafter as an additional MR image, can be used as a model. Corresponding k-space data from another of the MR images are used for reconstruction of the MR image instead of k-space data that are not acquired for the additional MR image during MR data acquisition (i.e. sampling (filling) of k-space).

When a model is used, the iterative reconstruction method takes this model into account by comparing certain properties of the currently reconstructed MR image with the corresponding model. As a result of this comparison, the reconstructed MR image can be corrected such that its properties better correspond to the properties of the model. This procedure may be continued until a defined stop criterion is fulfilled.

Usually, it is sufficient to use only one model for reconstruction of all the MR images. It may be advantageous to set measurement parameters with which the MR data for the additional MR image (as the basis for the model) is captured in the center of a variation range by which the respective measurement parameter for capturing the MR data of all the MR images varies.

For example, if the measurement parameter TR varies between 10 and 14 ms and the measurement parameter flip angle between 5 and 60° for MR fingerprinting measurement (i.e. for the measurement of MR data for all MR images), the MR data for the additional MR image could be acquired, for example, using a TR of 12 ms and a flip angle of 32.5°.

It explained above, instead of k-space data that were not captured for the additional MR image, k-space data from another MR image are used for reconstruction of the additional MR image. According to the invention, this procedure may be used for every (undersampled) MR image. In other words, MR data from k-space points and/or k-space lines that were acquired for another MR image are used for MR data from certain k-space points or k-space lines that were not acquired for the respective MR image. The particular k-space points that were not acquired are located at the same place in k-space as k-space points that were acquired as part of MR data acquisition for the other MR image.

The MR image, the measurement parameters of which most closely resemble the measurement parameters of the additional MR image, is selected as the other MR image from which the MR data are used.

By selecting, as the other MR image, the MR image for which the measurement parameters resemble the measurement parameters of the additional MR image as much as possible, it may be advantageously assumed that the MR data of k-space points of the other MR image also correspond to the non-captured MR data of the particular k-space points of the additional MR image as much as possible.

In accordance with another embodiment of the invention, k-space data that were not recorded for an MR image are replaced by k-space data that are obtained in a measurement (i.e. a prescan) that is implemented before the MR data acquisition of the MR images. In particular, this prescan has the same resolution as the measurements of the MR images. The MR data and/or k-space data of the prescan can be used for the reconstruction of the additional MR image (as the basis for the model of the iterative reconstruction), as well as for the reconstruction of any MR images.

As in the case of data acquisition of MR data for the additional MR image, it may be advantageous, for the data acquisition of the prescan, to set the measurement parameters in the center of the variation range by which the respective measurement parameter for the acquisition of MR data of all MR images varies.

The method according to the invention can also be combined with other MR acceleration methods, such as parallel MR image capture (e.g. GRAPPA ("GeneRalized Autocalibrating Partially Parallel Acquisition")) and/or with so-called Partial Fourier data capture.

With Partial Fourier data capture, k-space data are not captured symmetrically around k-space center. Instead, half of k-space is essentially filled in its entirety while only a few points of the other half of k-space are filled with data entries.

The acquisition of a number of MR images of the volume section is performed by acquiring precisely one k-space line per k-space in an initial procedure before a second k-space line of one of k-spaces is captured. However, all k-space lines of the same k-space to be acquired are always acquired with the same measurement parameter set (i.e. with the same setting of the measurement parameter).

If several multi-shot MR images are acquired for other purposes (not for an MR fingerprinting measurement), it is usual to first acquire the entirety MR data of one of these MR images before the MR data of the next MR image are acquired. By this procedure, wherein k-space line after k-space line are scanned using the same measurement parameters, the magnetization of the nuclear spins enters into a steady state, which is undesirable for a MR fingerprinting measurement. Therefore, in accordance with the present invention two k-space lines of the same k-space are never captured in immediate succession. Instead, two k-space lines captured directly in succession advantageously always pertain to different k-spaces and are therefore also captured with different measurement parameters.

It is particularly advantageous if only one k-space line per k-space is recorded in the first procedure before an additional k-space line is captured per k-space in a second procedure. With the first procedure, another k-space line may be involved in each k-space. For example, in the first k-space, the third k-space line and in the second k-space, the tenth k-space line is sampled in the first procedure. This procedure is continued until k-space lines to be sampled are sampled in each k-space. This does not mean that this same number of k-space lines is sampled in each k-space. If, for example, only 100 k-space lines are to be sampled in a k-space, in the 101st procedure a k-space line is only sampled in those k-spaces in which not all of k-space lines to be sampled have yet been sampled.

A magnetic resonance apparatus for examining a predetermined volume section of an examination object is also provided as part of the present invention. The magnetic resonance apparatus has a scanner with a basic field magnet, a gradient coil arrangement with a gradient control processor/amplifier, an RF antenna with an RF antenna control processor/amplifier and a control computer. The magnetic resonance apparatus is designed to acquire a number of MR images of the volume section in order to create an MR waveform for a number of voxels of the volume section in order to compare the MR waveform of the respective voxel with, for example, MR waveforms stored in a database of the magnetic resonance apparatus. This composition is made by a comparator of the control computer in order to ascertain the stored MR waveform that best corresponds to the captured MR waveform of the respective voxel. The control computer provides the result of this comparison as an output. A physical value and/or a substance of the voxel are the result of the comparison. The magnetic resonance apparatus acquires each k-space that corresponds to one of the MR images using a number of repetitions.

The advantages of the magnetic resonance apparatus according to the invention essentially correspond to the advantages of the method according to the invention that have been described above.

Furthermore, the present invention encompasses a non-transitory, computer-readable data storage medium that can be loaded into the memory of a programmable control system or a computer of a magnetic resonance apparatus. The storage medium is encoded with programming instructions that cause all or various previously described embodiments of the method according to the invention to be performed when executed in the system or control computer of the magnetic resonance apparatus. The programming instructions may require program resources, e.g. libraries and auxiliary functions to realize the corresponding embodiments of the method. The programming instructions may involve a source code (e.g. C++) which still has to be compiled (translated) and linked or which only has to be interpreted, or an executable software code which only remains to be loaded into the corresponding computer and/or control device for execution.

The electronically readable data medium may be a DVD, a magnetic tape, a hard disk or a USB stick on which electronically readable control information, in particular software (cf. above), is stored.

The present invention seeks to dispense with vulnerable measurement methods that are not robust (for example, single-shot MR methods which operate with a spiral k-space trajectory) for MR fingerprinting measurements without the measurement period having to be excessively extended as a result. For example, by using a repetition to sample each k-space line, the quality of the generated MR images can be drastically improved. In the present invention the number of MR images, which according to the prior art is very high (e.g. up to 5000), can therefore be greatly reduced to 100 MR images, for example, in order to compensate for systematic errors and to be able to average out any errors based on strong artifacts. In addition, if only a certain percentage of k-space lines is captured (i.e. k-space is undersampled), the measurement period for an MR fingerprinting measurement according to the invention is at least in the range of an MR fingerprinting measurement according to the prior art.

BRIEF DESCRIPTION OF THE DRAWINGS

FIG. 1 is a block diagram of a magnetic resonance apparatus according to the invention.

FIG. 2 illustrates the procedure for the present invention in detail.

FIG. 3 is a flowchart of a method according to the invention.

DESCRIPTION OF THE PREFERRED EMBODIMENTS

FIG. 1 is a schematically illustration of a magnetic resonance apparatus 10 according to the invention. The magnetic resonance apparatus 10 has a data acquisition unit formed by a scanner 13 with a basic field magnet 17 for the generation of a strong and constant basic magnetic field 18. The magnetic resonance scanner 13 has a cylindrical patient receptacle 14 for receiving an examination object, in this case a patient 15. The patient receptacle 14 is cylindrically enclosed by the scanner 13 in a circumferential direction. The patient 15 can be moved into the patient receptacle 14 by a patient support 16. The patient support 16 has a support table for this purpose, which is arranged in a mobile manner inside the magnetic resonance scanner 13. The scanner 13 is shielded externally by a housing shell 31.

Furthermore, the scanner 13 has a gradient coil arrangement 19 for the generation of a magnetic field gradient that is used for spatial encoding during imaging. The gradient coil arrangement 19 is controlled by a gradient control processor 28. Furthermore, the scanner 13 has a radio-frequency antenna 20, which in this case is designed as a whole body coil permanently integrated into the magnetic resonance scanner 13, and a radio-frequency antenna control processor 29 for the excitation of nuclear spins so as to deviate from the polarization which occurs in the basic magnetic field 18 generated by the basic field magnet 17. The radio-frequency antenna 20 is controlled by the radio-frequency antenna control processor 29 and radiates radio-frequency magnetic resonance frequencies into an examination volume that essentially includes the patient receptacle 14. Furthermore, the radio-frequency antenna 20 is designed to receive magnetic resonance signals from the patient 15.

The magnetic resonance apparatus 10 has a control computer 24 that operates the basic field magnet 17, the gradient control processor 28 and the radio-frequency antenna control processor 29. The computer 24 controls the magnetic resonance apparatus 10 centrally, for example, to perform a predetermined imaging gradient-echo sequence. Control information such as imaging parameters and reconstructed MR images can be provided for a user via an output interface, in this case a display monitor 25, of the magnetic resonance apparatus 10. In addition, the magnetic resonance apparatus 10 has an input interface 26 via which information and/or parameters can be entered by a user during a measurement operation. The computer 24 may include the gradient control processor 28 and/or radio-frequency antenna control processor 29 and/or the display monitor 25 and/or the input interface 26.

The computer 24 also has a comparator 33.

Furthermore, the magnetic resonance apparatus 10 has a waveform acquisition unit 32. In this case, the waveform acquisition unit 32 is formed by the scanner 13 with the radio-frequency antenna control processor 29 and the gradient control processor 28. The magnetic resonance apparatus 10 is thus designed together with the waveform acquisition unit 32, the computer 24 and the display monitor 25 for performance of the method according to the invention through the generation of an MR waveform on the basis of MR images which are each captured with a number of repetitions (i.e. with multi-shot MR methods) by the magnetic resonance apparatus 10.

The selection of corresponding control programs for an MR fingerprinting examination which e.g. is stored on a DVD 36, and the display of the results generated thereby takes place via a screen of the display monitor 25. The input interface 26 has a keyboard 35, a mouse 34 and the screen of the display monitor 25.

The magnetic resonance apparatus 10 may have additional components that are usually present in magnetic resonance apparatuses. The general operation of a magnetic resonance apparatus 10 is known to those of ordinary skill in the art, so a detailed description of the additional components is not necessary herein.

The present invention is explained in detail on the basis of FIG. 2.

As part of an MR fingerprinting measurement, one MR waveform (i.e. a path of an MR signal S) is created per voxel 9. The creation of a number of MR images $B_1$-$B_5$ is necessary for this. A predetermined volume section is sampled a number of times to create the MR images $B_1$-$B_5$ by sampling k-space K corresponding to the volume section a number of times. Various measurement parameters (flip angle FW, repetition time TR) are used for respective sampling of k-space K.

The path of the flip angle FW can be identified in FIG. 2 on the basis of the reference characters $FW_1$ to $FW_5$ and the path of the repetition time TR on the basis of the reference characters $TR_1$ to $TR_5$. The respective k-space K is sampled using these measurement parameters FW, TR individual to the respective k-space K. While according to the prior art the respective k-space $K_1$ to $K_5$ is captured in full with a single-shot measurement method, the respective k-space for the present invention is captured line-by-line (i.e. one k-space line per repetition). However, according to the invention not all k-space lines are sampled, rather only a few k-space lines are acquired in the external area of k-space specifically (i.e. at the top and bottom in FIG. 2) while k-space lines in the center (in k-space center) are captured in full as much as possible.

The MR images $B_1$ to $B_5$ are reconstructed through a reconstruction of the captured MR data, wherein the MR signal $S_1$ to $S_5$ of the same voxel or pixel 9 is shown for all the reconstructed MR images $B_1$ to $B_5$ in the form of an MR signal path in FIG. 2.

FIG. 3 is a flowchart of a method according to the invention method.

In the first step S1 a procedure is defined in order to enable the creation of 100 measurement parameter sets for the performance of a fingerprinting measurement. In addition, the control variables i and k are set to 1.

In the step S2 the k-th line of the i-th k-space is captured with the i-th measurement parameter set. In other words, each k-space line of the same k-space to be captured is captured with the same measurement parameter set, which differs from the measurement parameter set of the other k-spaces. With regard to its position in the respective k-space, the k-th line of a k-space must not correspond to the k-th line of another k-space. The capture of the k-th line only means the line to be captured as k-th (first, second, third, etc.). In other words, the k-th line of a k-space may involve the fifth line of k-space, while the k-th line of another k-space may involve the eighth line.

After the running index i is incremented in step S3, whether a k-space line has already been recorded for all k-spaces is verified in step S4. If not, steps S2 and S3 are repeated.

The flowchart shown in FIG. 3 is simplified. According to the invention, the same number of k-space lines need not be captured in each k-space. Therefore, in step S2 a k-th line is only captured for the i-th k-space if all k-space lines to be captured for this i-th k-space have not already been acquired.

If the query in step S4 receives a positive response, in step S5 the running index k is incremented, and the running index i is reset to 1. Whether the running index k has already reached its maximum is then reviewed in step S6. In the example shown, it is assumed that no more than 128 k-space lines are to be acquired for any k-space. If the running index k has not yet reached its maximum, the step S2 is repeated.

If all the MR data have been acquired (i.e. k-space lines to be acquired were sampled in all k-spaces), the method proceeds to step S7 in which the MR data and/or k-space data for an MR image are compiled. Because the respective k-space is not sampled in full, missing k-space data are accepted by another k-space for which the corresponding k-space data was captured. Then the respective MR image is reconstructed in step S8 from k-space data previously compiled in step S7. If it is recognized that not all the (e.g. 100) MR images have been reconstructed in step S9, the method returns to step S7.

In step S10 it is ensured that all the MR images were reconstructed. Now in step S10 an MR waveform is created for a particular voxel on the basis of the reconstructed MR image. In the following step S11 the stored MR waveform which best corresponds to the MR waveform created in step S10 is determined. On the basis of this particular stored MR waveform, a property of the voxel (e.g. a physical variable or a substance present in the voxel) is determined in step S12. A query is made in step S13 as to whether the properties for a predefined number of voxels have been determined and, if so, the method terminates. The method otherwise (if the properties of particular voxels have yet to be determined) returns to step S10.

I claim as my invention:

1. A method for magnetic resonance (MR) examination of a predetermined volume section of an examination subject, comprising:
    operating an MR scanner while an examination object is situated therein to acquire MR raw data from a predetermined volume section of the examination object to obtain a plurality of k-space datasets each comprising a plurality of lines in which said MR data are respectively entered by operating said MR scanner in a plurality of repetitions for each k-space dataset, with exactly one k-space line in each k-space dataset being acquired before a second k-space line in another of said k-space datasets is acquired, with k-space lines of a same k-space being acquired using identical measurement parameters, and with each repetition comprising a radio-frequency (RF) excitation of nuclear spins in the predetermined volume section and a data read-out of said MR data;
    in a computer, reconstructing an MR image from each k-space dataset, thereby obtaining a plurality of MR images of the predetermined volume section, with each MR image comprised of voxels;
    in said computer, generating an MR waveform for respective voxels of the volume section from said MR images;
    in said computer, comparing said MR waveform of a respective voxel with a plurality of stored MR waveforms to obtain a comparison result that designates a stored waveform, among said plurality of stored waveforms, that best corresponds to said MR waveform; and
    in said computer, making a determination of at least one of physical value and a substance of the respective voxel dependent on said comparison result, and making said determination available from said computer as an output in electronic form.

2. A method as claimed in claim 1 wherein said k-space datasets represents a respective k-space, and generating each k-space dataset by undersampling the respective k-space represented thereby.

3. A method as claimed in claim 2 comprising, in each k-space dataset, undersampling a central region of k-space less than undersampling in a peripheral region of k-space.

4. A method as claimed in claim 2 comprising entering said MR data into the respective k-space represented by each k-space dataset at respective data points, with a frequency at which said MR data are entered at respective data points decreasing the farther that a respective data point is from a center of the respective k-space.

5. A method as claimed in claim 2 wherein each k-space is comprised of a plurality of k-space points which said MR data are entered, and, within said plurality of repetitions, entering data at each k-space point in each k-space at least once.

6. A method as claimed in claim 2 comprising using an iterative reconstruction algorithm to reconstruct the respective MR images from each undersampled k-space.

7. A method as claimed in claim 6 comprising, in said computer, selecting one of said MR images for use as a model in said iterative reconstruction algorithm, wherein k-space dataset for said one of said MR images exhibits missing k-space data due to said undersampling, and providing said missing k-space data from the respective k-space dataset of another of said MR images.

8. A method as claimed in claim 7 comprising operating said MR scanner to vary data acquisition parameters among the respective repetitions for each k-space dataset within a variation range, and selecting said MR image for use as said model as an MR image for which the MR data in the respective k-space dataset were acquired with data acquisition parameters in a middle of said variation range.

9. A method as claimed in claim 1 wherein each of said k-space datasets represents a respective k-space, and wherein entry of said MR data into at least one of said respective k-spaces is incomplete, and using MR data from another of the respective k-space datasets to reconstruct the respective MR image from k-space dataset having an incomplete k-space.

10. A method as claimed in claim 9 comprising operating said MR scanner to acquire said MR data for the respective k-space datasets with data acquisition parameters among said repetitions being set differently for different repetitions, and wherein at least one of said k-space datasets is not completely filled with k-space data from said MR signals, and filling said one of said k-space datasets with k-space data from MR signals acquired in another of said k-space datasets using data acquisition parameters that most closely resemble the data acquisition parameters for the incomplete k-space dataset.

11. A method as claimed in claim 1 comprising operating said MR scanner in a prescan prior to acquiring said MR signals for said k-space datasets, to obtain a prescan k-space dataset that is completely filled, and wherein at least one of said subsequently obtained k-space datasets is incompletely filled, and filling said at least one incompletely filled k-space dataset with k-space data from said prescan k-space dataset.

12. A method as claimed in claim 11 comprising operating said MR scanner to acquire said MR signals for said k-space datasets with data acquisition parameters among the plurality of repetitions being set differently within a variation range, and operating said MR dataset to acquire said prescan k-space dataset with data acquisition parameters in a middle of said variation range.

13. A method as claimed in claim 1 comprising acquiring said k-space datasets in parallel.

14. A method as claimed in claim 1 comprising reconstructing said MR images using a partial Fourier transformation.

15. A magnetic resonance (MR) apparatus comprising:
    an MR scanner;
    a computer configured to operate said MR scanner while an examination object is situated therein to acquire MR raw data from a predetermined volume section of the examination object to obtain a plurality of k-space datasets each comprising a plurality of lines in which said MR data are respectively entered by operating said MR scanner in a plurality of repetitions for each k-space dataset, with exactly one k-space line in each k-space dataset being acquired before a second k-space line in another of said k-space datasets is acquired, with k-space lines of a same k-space being acquired using identical measurement parameters, and with each repetition comprising a radio-frequency (RF) excitation of nuclear spins in the predetermined volume section and a data read-out of said MR data;
    said computer being configured to reconstruct an MR image from each k-space dataset, thereby obtaining a plurality of MR images of the predetermined volume section, with each MR image comprised of voxels;

said computer being configured to generate an MR waveform for respective voxels of the volume section from said MR images;

said computer being configured to compare said MR waveform of a respective voxel with a plurality of stored MR waveforms to obtain a comparison result that designates a stored waveform, among said plurality of stored waveforms, that best corresponds to said MR waveform; and said computer being configured to make a determination of at least one of physical value and a substance of the respective voxel dependent on said comparison result, and to make said determination available from said computer as an output in electronic form.

16. A non-transitory, computer-readable data storage medium encoded with programming instructions, said storage medium being loaded into a control computer of a magnetic resonance (MR) apparatus that comprises an MR scanner, said programming instructions causing said control computer to:

operate said MR scanner while an examination object is situated therein to acquire MR raw data from a predetermined volume section of the examination object to obtain a plurality of k-space datasets each comprising a plurality of lines in which said MR data are respectively entered by operating said MR scanner in a plurality of repetitions for each k-space dataset, with exactly one k-space line in each k-space dataset being acquired before a second k-space line in another of said k-space datasets is acquired, with k-space lines of a same k-space being acquired using identical measurement parameters, and with each repetition comprising a radio-frequency (RF) excitation of nuclear spins in the predetermined volume section and a data read-out of said MR data;

reconstruct an MR image from each k-space dataset, thereby obtaining a plurality of MR images of the predetermined volume section, with each MR image comprised of voxels;

generate an MR waveform for respective voxels of the volume section from said MR images;

compare said MR waveform of a respective voxel with a plurality of stored MR waveforms to obtain a comparison result that designates a stored waveform, among said plurality of stored waveforms, that best corresponds to said MR waveform; and make a determination of at least one of physical value and a substance of the respective voxel dependent on said comparison result, and make said determination available from said computer as an output in electronic form.

* * * * *